United States Patent [19]
Engeler
[11] 3,808,472
[45] Apr. 30, 1974

[54] VARIABLE CAPACITANCE SEMICONDUCTOR DEVICES

[75] Inventor: William E. Engeler, Schenectady, N.Y.
[73] Assignee: General Electric Company, Schenectady, N.Y.

[22] Filed: Dec. 29, 1972
[21] Appl. No.: 319,324

[52] U.S. Cl. .... 317/234 R, 317/234 UA, 317/235 B
[51] Int. Cl. .... H01l 11/00
[58] Field of Search .... 317/234, 235

[56] References Cited

UNITED STATES PATENTS

| | | | |
|---|---|---|---|
| 3,562,608 | 2/1971 | Gallagher et al. | 317/235 |
| 3,604,990 | 9/1971 | Sigsbee | 317/234 |
| 3,633,078 | 1/1973 | Dill et al. | 317/234 |
| 3,612,964 | 10/1971 | Kawazu | 317/235 |
| 3,591,836 | 7/1971 | Booher et al. | 317/231 |

*Primary Examiner*—Rudolph V. Rolinec
*Assistant Examiner*—E. Wojciechowicz
*Attorney, Agent, or Firm*—Julius J. Zaskalicky; Joseph I. Cohen; Jerome C. Squillaro

[57] ABSTRACT

A device comprising a body of semiconductor material of one conductivity type, a film of conductive material insulatingly overlying a surface adjacent region of the body to provide a first electrode of the device, and a second electrode in contact with another region of the body is provided. A third or capacitance controlling electrode and a channel region of opposite conductivity type in the body of semiconductor material adjacent the major surface thereof between the third electrode and the surface adjacent region are also provided. In operation, a depletion producing voltage is applied between the first and second electrodes. Another voltage for controlling the capacitance of the device is applied between the second and the third electrodes to establish in the surface adjacent region a potential between the potentials of the first and second electrodes. The time constant of the capacitance of the surface adjacent region and the resistance of the channel region of opposite conductivity type is set to be short in relation to the time which would be required to establish inversion in conductivity type of the surface adjacent region in response to normal minority carrier generation therein in a structure not containing the channel region and the third electrode and to be long in relation to the frequency of operation of the device whereby the capacitance presented across the first and second electrodes is determined by the voltage applied to the third electrode.

18 Claims, 11 Drawing Figures

VARIABLE CAPACITANCE SEMICONDUCTOR DEVICES

The present invention relates in general to MIS (metal-insulator-semiconductor) capacitance devices including circuits therefor, and in particular relates to providing in such devices means independent of the capacitance providing electrodes for varying the capacitance thereof.

Semiconductor voltage variable capacitance devices commonly referred to as varactor diodes provide voltage dependent capacitance which is a function of the voltage applied including both the operating voltage and the applied signal voltage between the two electrodes thereof. The present invention is directed to providing a novel variable capacitance semiconductor device in which the capacitance thereof is substantially independent of the signal voltage appearing across the capacitance providing electrodes of the device.

Accordingly, an object of the present invention is to provide improvements in variable capacitance devices and circuits therefor.

Another object of the present invention is to provide a voltage variable capacitance device particularly suitable for operation at high frequencies.

Another object of the present invention is to provide a semiconductor voltage variable capacitance device of improved performance characteristics.

In carrying out the invention in one illustrative embodiment thereof, there is provided a body of semiconductor material of one type conductivity having a major surface. A film of conductive material insulatingly overlies a surface adjacent region of the body and constitutes a first electrode of the device. A conductive contact is made to another region of the body to form the second electrode of the device. A third electrode is provided remote from the surface adjacent region and a channel region of opposite conductivity type semiconductor material is formed in the body adjacent the major face between the third electrode and the surface adjacent region. In the operation of the device, a depletion producing voltage is applied between the first and second electrodes. Another voltage for controlling the capacitance of the device is applied between the second and third electrodes and establishes in the surface adjacent region a potential between the potentials of the first and second electrodes. The time constant of the capacitance of the surface adjacent region and the resistance of the channel region of opposite conductivity type is set to be short in relation to the time which would be required to establish an inversion in conductivity type of the surface adjacent region in response to normal minority charrier generation therein in a structure not containing the channel region and the third electrode and to be long in relation to the frequency of operation of the device whereby the capacitance presented across the first and second electrodes is determined by the voltage applied to the third electrode. At high signal frequencies the source of control voltage connected to the third electrode becomes decoupled from the surface adjacent region with the result that the capacitance remains essentially constant and is independently variable by varying the voltage applied to the third electrode.

The novel features which are believed to be characteristic of the present invention are set forth with particularity in the appended claims. The invention itself, both as to its organization and method of operation together with further objects and advantages thereof, may best be understood with reference to the following description taken in connection with the accompanying drawings wherein:

Figure 1:
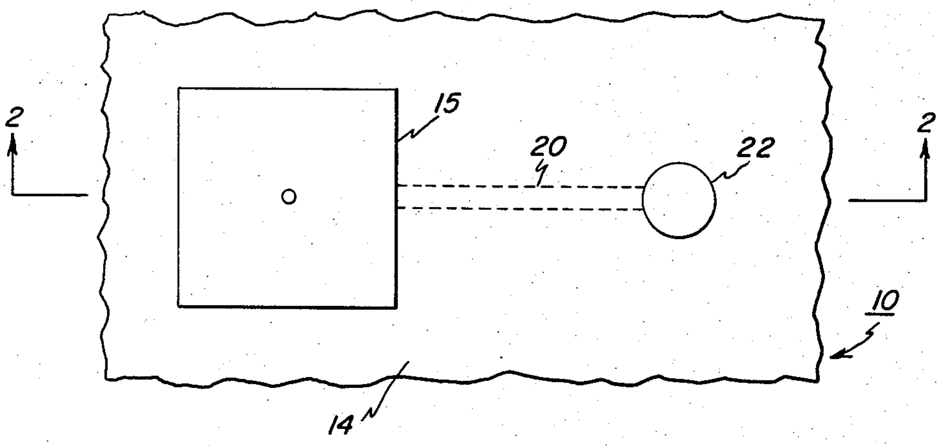
FIG. 1 shows a plan view of a semiconductor device in accordance with the present invention.
Figure 2:
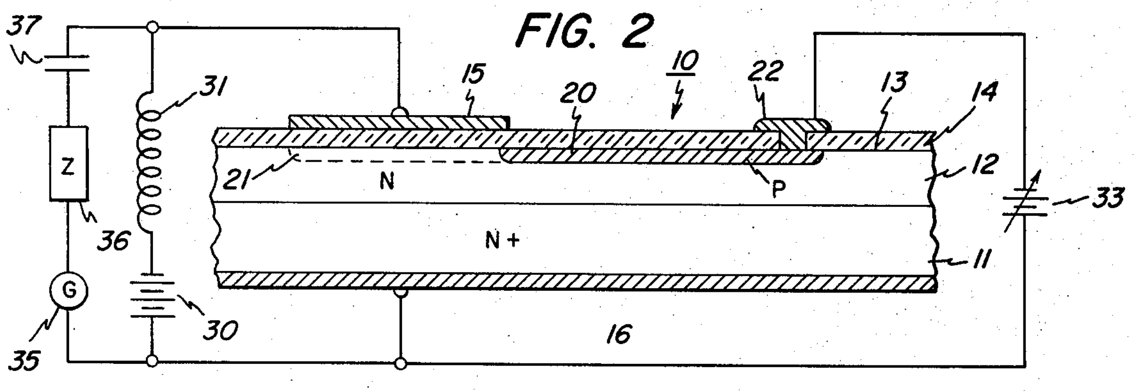
FIG. 2 shows a front elevation view in section of the semiconductor device of FIG. 1 including voltage biasing means and utilization circuits connected to the terminals of the semiconductor device.
Figure 3:
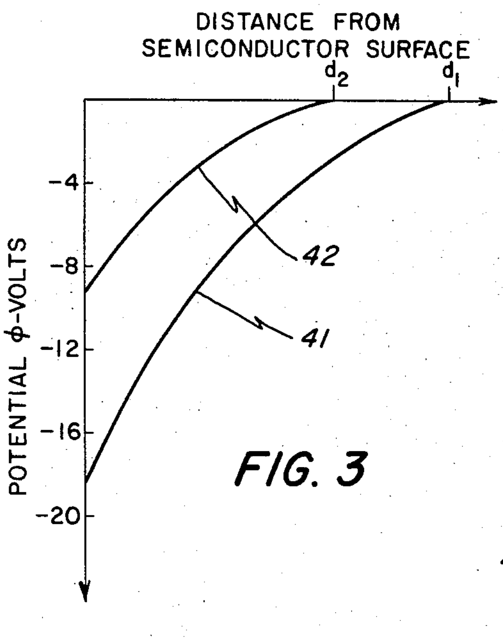

FIG. 3 shows a family of graphs of potentials in the semiconductor device of FIGS. 1 and 2 as a function of distance normal to the surface of the semiconductor body underlying the first electrode thereof, each graph representing the variation of potential from a maximum at the surface to a minimum at the maximum depletion depth for respective surface potentials at the surface corresponding to particular charge densities thereat.

Figure 4:
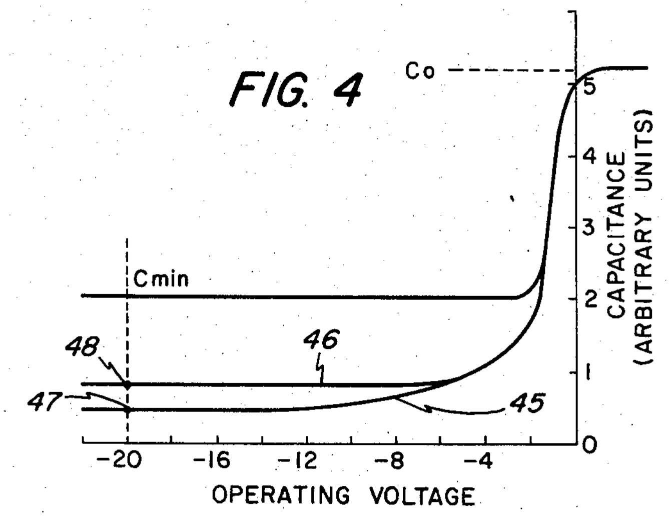

FIG. 4 shows a pair of graphs, each illustrating the manner in which the capacitance between the electrodes of the semiconductor device of FIGS. 1 and 2 varies as a function of the d-c operating voltage applied between the first and second electrodes for a respective control voltage applied between the second and third electrodes of the device of FIG. 2.

Figures 5, 6:
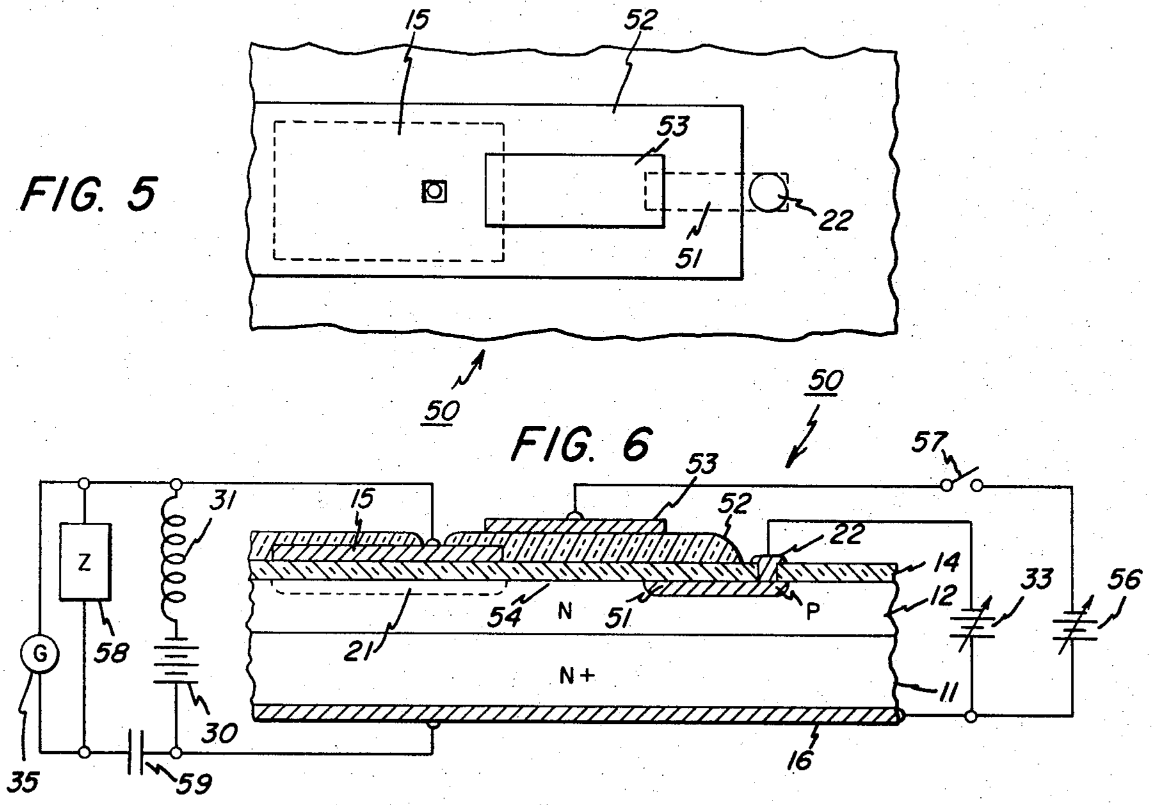

FIG. 5 shows a plan view of another embodiment of the present invention.

FIG. 6 is a front elevation view in section of the embodiment of FIG. 5 along with circuits for the operation thereof.

Figure 7:
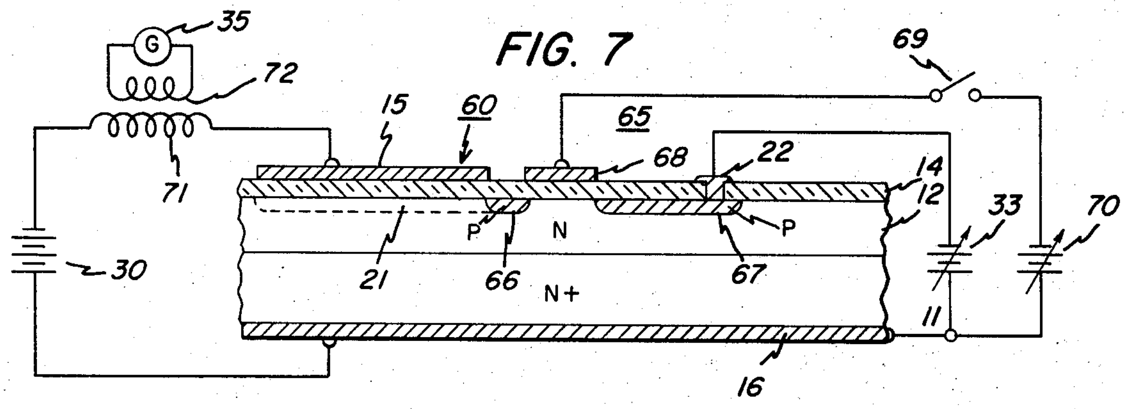

FIG. 7 is an elevation view in section of another embodiment of the present invention.

Figure 8:
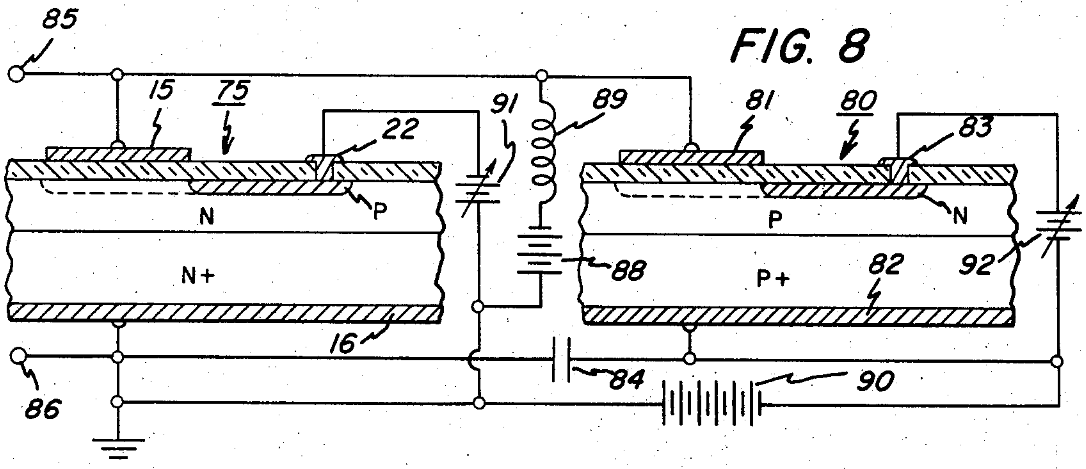

FIG. 8 shows another embodiment of the present invention including a pair of semiconductor devices which are constituted of semiconductor materials of different conductivity types and which are connected in the manner to compensate for small variations in capacitances of the devices with voltages appearing across the electrodes thereof.

Figure 9:
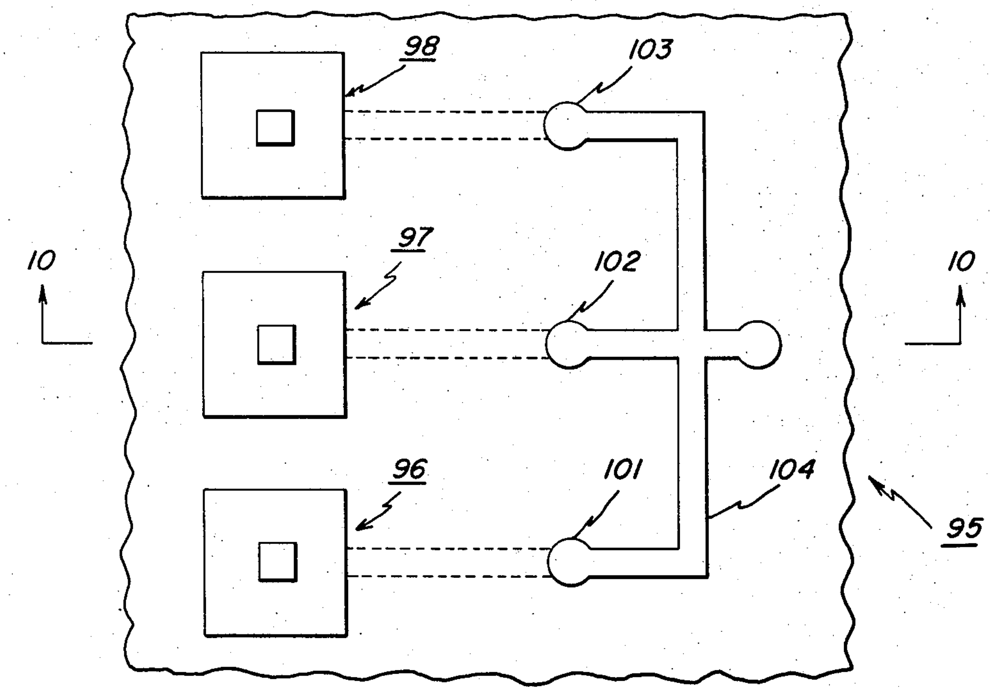

FIG. 9 is a plan view of a semiconductor device in accordance with the present invention in which is provided a plurality of variable capacitance devices with the control electrodes thereof in common.

Figure 10:
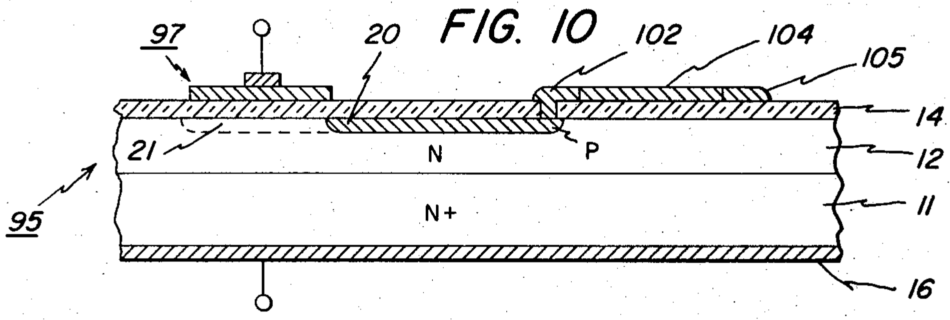

FIG. 10 is a sectional view of FIG. 9 taken along section lines 10—10.

Figure 11:
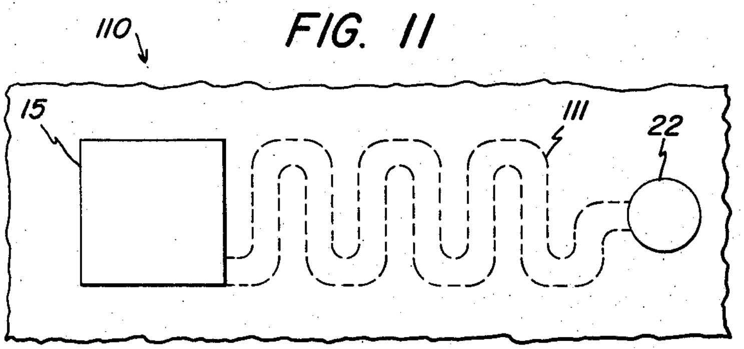

FIG. 11 shows a plan view of a further embodiment of the present invention.

Reference is now made to FIGS. 1 and 2 which show a semiconductor voltage variable capacitance device 10 in accordance with one embodiment of the present invention. The device includes a body of semiconductor material of one conductivity type, such as N-type silicon, for example. Conveniently, the body may be constituted of a substrate 11 of low resistivity silicon and a layer 12 of silicon of substantially higher resistivity epitaxially grown thereon and providing an exposed major face or surface 13. Conveniently, the substrate 11 may be 10 mils thick and the epitaxial layer 12 may be 10 microns thick. A thin layer 14 of a suitable insulating material such as silicon oxide, for example, 1000 Angstroms thick, is provided on the major exposed face 13 of the epitaxial layer. A conductive film or plate 15 of a suitable material such as molybdenum for example, is formed on the insulating layer overlying a portion of the major surface of the layer 13 and constitutes a first electrode of the device. Another film or plate 16 of material is secured to and in ohmic contact with the opposite face of the substrate and constitutes the second electrode of the device. Such a plate may, for example, constitute a header or support structure as commonly employed for semiconductor circuits. Also, for example, the plate may consist of a gold layer formed on top of a ceramic insulator so as to form a portion of a microstrip circuit. A channel region 20 of opposite conductivity type is provided adjacent the major face of the body contacting the surface adjacent region 21 of the epitaxial layer underlying the first electrode, that is, a slight overlap is provided between the channel region 20 and the plate 15 so that when depletion producing voltages are applied between the first and the second electrodes the channel region contacts or engages a surface portion of the surface adjacent region 21. The channel region 20 is of elongated configuration, extends away from the surface adjacent region and at a part remote from the surface adjacent region a third electrode 22 is provided. As will be further described and explained below the channel region is proportioned and has a resistivity to provide a high resistance between the surface adjacent region 21 and the third electrode 22. The conductivity of the channel region may also be controlled by use of a relatively high resistivity region formed by the implantation of relatively few acceptor impurity atoms. Resistances of the order of megohms may be formed in this manner.

A means for producing depletion in the semiconductor layer 12 is provided in the form of a battery 30 and a high frequency choke 31 connected in series so that the negative terminal of the battery is connected through the choke to the first electrode 15 and the positive terminal of the battery is connected to the second electrode 16. Another battery or source 33 of variable voltage is applied between the second electrode 16 and the third electrode 22 with the negative terminal of the source connected to the third terminal and the positive terminal connected to the second terminal. Also shown is a source 35 of high frequency signal, an impedance 36, for example an inductance, and a d-c blocking capacitor 37 connected in the order named between the second electrode 16 and the first electrode 15.

Reference is now made to FIG. 3 which shows a pair of graphs 41 and 42, each representing the distribution of potential in the semiconductor of a conductor-insulator-semiconductor (CIS) capacitor from one extreme value at the surface of the semiconductor insulatingly underlying the conductor to another extreme value at the maximum depletion depth for a given depletion producing voltage applied between the electrodes of the capacitor. The graphs in this figure are for a CIS capacitor in which the semiconductor layer is a uniform N-type conductivity of 5 ohm-cm resistivity, in which the insulation layer is 1000 Angstroms of silicon dioxide and in which the conductor or plate is constituted of molybdenum and is biased −20 volts with respect to the semiconductor layer. At this value of bias potential the CIS capacitor is biased beyond the threshold voltage (i.e., the voltage at which minority carriers generated in the semiconductor layer accumulate at the surface and invert the conductivity type of the surface adjacent region, or more precisely the threshold voltage is defined as the voltage at which the conduction and valence bands are bent such that the potential difference between the valence band at the surface and the bulk Fermi level is equal to the potential difference between the conduction band and the bulk Fermi level). With a voltage of −20 volts instantaneously applied to the CIS capacitor the surface potential becomes −17.5 volts and the surface charge density is zero, the potential distribution in the depletion region is as indicated in graph 41 from −17.5 at surface to zero at $d_1$, the distance to which the semiconductor layer is depleted of majority carriers. After a short period of time minority carriers thermally generated in the semiconductor layer, for example, accumulate at the surface. When the charge density at the surface is $2 \times 10^{12}$ carriers (holes) per square centimeter, the potential in the depletion region varies from −8 volts at the surface to zero at distance $d_2$ which is less than the distance $d_1$, as indicated in graph 42.

The portion of the device of FIG. 2 including the semiconductor layer 12, the insulating layer 14, the first and second electrodes 15 and 16 is a CIS capacitor such as described above. In accordance with the present invention the potential of the surface adjacent region 21 underlying the first electrode is controlled by the potential applied to the third electrode 22 as it is connected to the surface adjacent region by high resistance channel region 20. In such a structure, the capacitance appearing across the first and second electrodes is determined by the potential appearing on the third electrode. The capacitance appearing across the first and second electrodes is determined by the dielectric layers between them, that is, by the insulating layer between the first electrode 15 and the surface of the semiconductor layer 12, and by the depletion region produced in the surface adjacent region 21. With the operating voltage across the first and second electrodes constant, variation of the potential applied to the third electrode from −17.5 volts to zero at a slow rate would cause the capacitance appearing across the first and second electrodes to vary from a minimum value consisting of a small depletion capacitance in series with the dielectric capacitance, to a maximum value corresponding to a large depletion capacitance in series with the constant dielectric capacitance. Of course, with a bias potential of −8 V applied to the control electrode 22 the depletion capacitance corresponding to distance $d_2$ is intermediate the extreme values of depletion capacitance and hence the extreme values of the resultant capacitance. For the condition of zero voltage applied to the control electrode the relatively large capacitance obtained by the small depletion region in series with the insulator dielectric is the equilibrium capacitance which would be obtained if no control electrode were present, and sufficient time were allowed for the surface to come to equilibrium with the bulk Fermi level. This capacitance, often referred to as $C_{min}$ because it is the lowest value obtained in the usual C-V plot, is not the minimum but rather the maximum value of capacitance obtained when the control electrode is operated with negative potentials. Higher values of capacitance may be obtained when the conrol electrode is operated at positive potentials. This method of operation is generally not desireable due to the injection of charge into the bulk of the device.

When an alternating signal of small amplitude and low in frequency is applied between the first and second electrodes of the device 10 with a fixed potential on the third electrode, charge is cycled into and out of the surface adjacent region over the resistive channel region 20. When the frequency of the small amplitude alternating voltage signal is large in relation to the time constant of the of the channel region and the depletion capacitance of the surface adjacent region 21, the bias source 33 is decoupled from the surface adjacent region 21 and charge is not cycled into and out of the surface adjacent region to a significant extent, particularly if the frequency of the small amplitude alternating voltage signal is very large in relation to the aforementioned time constant. If the number of minority carriers generated in the semiconductor layer over a period of the high frequency signal is relatively small, the capacitance appearing between the first and second electrodes will be substantially constant, varying only slightly due to small changes of the capacitance versus operating voltage. The aforementioned time constant is substantially shorter than the time required for minority carriers to accumulate in the surface adjacent region upon application of the indicated potentials between the first and second electrodes in a structure not containing the channel region and the third electrode. The value of the capacitance between the first and second electrodes can be changed by changing the potential applied to the third or control electrode. This would cause a change of the surface potential of the surface adjacent region in accordance with the time constant of the control circuit including the resistance of the channel region and the depletion capacitance of the surface adjacent region. This time constant would be short enough to permit change in capacitance in response to the control voltage to satisfy the requirements of the system in which it is to be used, for example, in television channel selection circuits it should take a fraction of a second to avoid any noticeable delay in the response of the system to a change in control voltage. Thus, a means is provided for controlling the capacitance appearing across the first and second electrodes thereof by the potential applied to a third electrode under the conditions indicated i.e. the time constant of the depletion capacitance and the resistance of the channel region is set to be significantly shorter than the time it takes for sufficient minority carriers to be generated in the surface adjacent region to alter appreciably the surface potential of the surface adjacent region and to be substantially longer than the period of the high frequency signal.

Reference is now made to FIG. 4 which shows a pair of graphs 45 and 46, each illustrating the manner in which the capacitance between the first and second electrodes of the device of FIG. 2 varies as a function of d-c operating voltage applied between the first and second electrodes for a respective capacitance control voltage applied between the second and third electrodes. Graph 45 shows the manner in which the capacitance varies with operating voltage when the control voltage is −17.5 and graph 46 shows the manner in which the capacitance varies with operating voltage when the control voltage is −8 volts. If the operating voltage provided by battery 30 is set at 20 volts and the control voltage from variable source 33 set at −17.5, the lowest capacitance would be represented by point 47 on graph 45 corresponding to the largest depletion width. If the control voltage is set at −8 volts the capacitance would be represented by point 48 on graph 46. As the control voltage from source 33 is further decreased toward zero, the capacitance increases until at substantially zero control voltage the capacitance is at its highest value corresponding to the $C_{min}$ equilibrium value. For a device constituted of N-type conductivity silicon semiconductor layer of $10^{15}$ net donor activator concentration corresponding to a resistivity of about 5 ohm-cms., a silicon dioxide insulating layer 1000 Angstroms thick, a first electrode having an area 250 square mils, an operating potential of −20 V applied between the first and second electrodes and a control voltage of −14 applied to the third electrode with respect to the second electrode, a capacitance of 8 picofarads is obtained. When the control voltage is changed to −8 volts a capacitance of 10 picofarads is obtained. At zero volts the capacitance approaches the equilibrium capacitance $C_{min}$ of 20 picofarads. It is often desireable to increase the capacitance variation range of the device beyond that which may be obtained with a uniform concentration of impurities. This may be achieved by increasing the concentration near the surface of the semiconductor. This reduces the near equilibrium depletion depth and therefore increases $C_{min}$ to a value close to the insulation capacitance Co. With the application of more negative control voltages the depletion region is increased to a value approaching that obtained with a uniform concentration of impurities in the substrate.

In connection with each of the graphs of FIG. 4 for values of the applied operating voltage beyond which inversion of conductivity type occurs in the surface adjacent region the slope of the graph is small, decreases with increasing operating voltage, and approahces a zero value for large values of operating voltage. As the amplitude of signal voltage is small in relation to the selected operating voltage, only slight variation in capacitance is produced by variations in the amplitude of this voltage. Such variations in capacitance may be eliminated or compensated by paralleling a capacitance device in which the slope of the capacitance versus operating voltage characteristic is complementary to the device of FIG. 2 which uses an N-type semiconductor layer (i.e., increases with decreasing voltage), such as a capacitance device identical to the device of FIG. 2 except using a P-type semiconductor layer. A combination of devices in which this result is achieved is shown and described in connection with FIG. 8. This structure eliminates or substantially reduces signal distortion errors caused by capacity variation with signal voltage.

In the operation of the device of FIG. 2 in circuit, the operating source depletes majority carriers from the surface adjacent region underlying the first electrode and the control voltage from source 33 applied over channel region establishes a surface potential in the depleted surface adjacent region and hence a capacitance between the first and second electrodes corresponding to the control voltage. High frequency signal voltages applied in circuit with the first and second electrodes being small in amplitude in relation to the applied operating voltage and of high frequency do not have appreciable effect on the capacitance presented by the first and second electrode of the device. Variation of the control voltage produces a variation in the capacitance as described above in connection with FIGS. 3 and 4.

For the example recited above, the device having capacitance variable from 8 picofarads to 20 picofarads could be used for example in the r-f or i-f stages of television receivers where frequencies of many megahertz are used. A suitable time constant for the depletion capacitance-channel resistance circuit would be several microseconds. A minority carrier generation rate which would fill the inversion channel in milliseconds would be sufficiently small to provide the operation of the invention in the manner described above.

Reference is now made to FIGS. 5 and 6 which shows another embodiment of the present invention similar to the embodiment of FIG. 2. Elements of the device of FIGS. 5 and 6 identical to the elements of the device of FIG. 2 are identically designated. In the device 50 of FIGS. 5 and 6 the channel region 51 of P-type conductivity extends part way to the surface adjacent region 21 underlying the first electrode 15 and does not directly contact the surface adjacent region. A layer of insulating material 52, such as silicon dioxide, is provided over the exposed surface of the insulating layer 14 and the first film 15 of conductive material. A second conductive film or plate 53 of narrow and elongated form constituting a fourth electrode is provided over the layer 52 of insulation overlapping the first conductive film 15 and also overlapping the edge of the channel region 51 remote from the third electrode 22. The second film 53 thus insulatingly overlies the surface adjacent portion of the region 54 between the surface adjacent region 21 and the channel region 51 of P-type conductivity. The depletion producing voltage applied from source 56 and through switch 57 between the fourth electrode and the second electrode can invert the region 54 of the semiconductor layer lying thereunder to provide a resistive connection between the surface adjacent region 21 and the third electrode 22. Thus a means is provided for switching in the capacitance control voltage from source 33, as desired, as well as providing the desired channel resistance between the surface adjacent region 21 and the third electrode 21 by means of control of inversion in conductivity of region 54 underlying the fourth electrode 53. In this figure are also shown as mentioned a bias source 56 connected through a switch 57 between the fourth electrode 53 and the second electrode 16 and also shows a generalized impedance 58 which may, for example, be an inductance connected in parallel with the capacitance appearing across the first and second electrodes to provide a tuned circuit, and a source of high frequency signal connected between the first and second electrodes through a d-c blocking capacitor 59. The potential of the source 56 is set so as to be able to produce an inversion channel of a predetermined high resistance between the surface adjacent region 21 and the P-type region 51 when applied. When the switch 57 is closed a high resistance channel is provided between the third electrode 22 and the surface adjacent region 21 and the device thereafter operates in response to variations of the control voltage from source 33 in a manner identical to manner of operation of the device of FIG. 2. The component of channel resistance provided by P-type region 51 can be made as large a proportion of the total channel resistance between the third electrode and the surface adjacent region 21 as desired. Also the channel resistance provided by the inversion of conductivity of region 54 may be changed as desired by simply changing the gating voltage provided by the source 56.

Reference is now made to FIG. 7 which shows a device 60 similar to the device 10 of FIG. 2. Elements of device 60 identical to the elements of the device 10 of FIG. 2 are identically designated. In device 60, a field effect transistor 65 is formed on the layer 12 to provide the channel resistance between the surface adjacent region 21 and the third electrode 22. The field effect transistor 65 includes a small P-type source region 66 contacting the surface adjacent region 21, and a P-type drain region 67 contacting the third electrode, and gate electrode 68 on the insulating layer 14 in overlapping relationship to the source and drain regions. The gate electrode 68 is connected through a switch 69 to the negative terminal of control voltage source 70, the positive terminal of which is connected to the second electrode 16. Operating potential is applied to the first and second electrodes by a d-c source 30, the negative terminal of which is connected through an inductance 71 to the first electrode 15 and the positive terminal of which is connected to the second electrode of the device. A source 35 of high frequency signal is coupled into circuit formed by the inductance 71 and the capacitance appearing between the first and second electrodes 15 and 16 by means of another inductance 72 connected in circuit with source 35 and coupled to the inductance 71. In operation, with the field effect transistor 65 rendered conductive by closing of switch 69 and application of a suitable gating potential thereto from source 70, the potential at the third electrode 22 appears at the surface adjacent region 21 and determines the capacitance appearing across the first and second electrodes 15 and 16 and hence the response of the circuit connected thereto. Varying the control potential 33 varies the capacitance of the device and hence the response of the circuit connected thereto. For proper operation source diffused region 66 should be made as small as possible in comparison to electrode 15. This prevents appreciable charge from being cycled back and fourth between P-type source region 66 and the surface adjacent region 21 when a signal voltage is applied between electrodes 15 and 16.

Reference is now made to FIG. 8 which shows a pair of devices 75 and 80 similar to the device 10 of FIG. 2 connected in a particular circuit configuration to compensate for variations of capacitance with applied signal voltage. The device 75 is identical to the device 10 of FIG. 2 and a device 80 is identical to the device 10 of FIG. 2 except that a P-type substrate and a P-type epitaxial layer is formed thereon. The device 75 has a capacitance versus operating voltage characteristics similar to the capacitance versus operating voltage characteristics of the device 10 shown in FIG. 4. The capacitance voltage characteristics of device 80 is complementary to the capacitance-voltage characteristics of device 75, i.e., the capacitance of device 80 decreases when operating voltage increases in the positive direction. The device 75 including the body of semiconductor material of N-type includes a first electrode 15, a second electrode 16 and a third electrode 22. The device including a body of P-type semiconductor material includes a fourth electrode 81, a fifth electrode 82 and a sixth electrode 83 corresponding respectively to the first, second and third electrodes of the device 75. The first and fourth electrodes 15 and 81 are connected together and to a first capacitance providing output terminal 85. The second and fifth electrodes 16 and 82 are capacitively connected together by capacitor 84 having a low impedance at high frequencies and to a second capacitance providing output terminal 86 which is also connected to ground. Battery 88 having its positive terminal connected to the second electrode 16 and ground and its negative terminal connected through high frequency choke 89 to the first electrode 15 provides operating voltage to the first device 75. Battery 90 having its positive terminal connected to the second electrode 16 and ground and its negative terminal connected to the fifth electrode 82 provides in conjunction with battery 88 operating voltage to the second device 80. With the devices identical except for conductivity type of the semiconductor material, the voltage of battery 90 would normally be double the voltage of battery 88 to provide balanced operating voltages to the devices 75 and 80. A variable voltage source 91 is connected between the third electrode and the second electrode to control the potential thereof and similarly another variable source 92 is connected between the sixth and the fifth electrode to control the potential thereof. Devices 75 and 80 are constituted to provide substantially balanced capacitances and the operating voltages are set so that the capacitances are substantially identical. If it is assumed that the device 95 has the capacitance-voltage characteristics of FIG. 4, the device 80 would have the substantially identical characteristic for corresponding positive operating voltages. Accordingly, as the amplitude of the signal applied across terminals 85 and 86 varies the small change in capacitance effected in device 75 in one direction is compensated by a corresponding change in device 80 in the opposite direction with the net resultant that substantially no change occurs in the resultant capacitance appearing across terminals 85 and 86.

Reference is now made to FIGS. 9 and 10 which show composite device 95 in which a plurality of voltage variable capacitance devices 96, 97 and 98 are formed on a single substrate each identical to the device 10 of FIG. 2. The third electrodes 101, 102 and 103 of respective devices 96, 97 and 98 conductively connected together and to control voltage terminal 105 by conductive member 104 enable the capacitances provided by the devices 96, 97 and 98 to be controlled from a common potential source which would be connected between electrode 16 and terminal 105. Such a combination of devices would be useful in heterodyne circuits for radio and television receiver systems where r-f amplifiers, local oscillators and converters are gang tuned. It should also be pointed out that whereas FIGS. 9 and 10 show a ganged device similar to the embodiment of FIG. 2, ganged devices utilizing the embodiments of FIGS. 5, 6 and 7 may also be formed where a single electrode controls the capacitance of several variable capacitances.

Reference is now made to FIG. 11 which shows a device 110 identical to the device 10 of FIG. 2 except that the resistive channel region 111 thereof is curvilinear or serpentine in form to provide the desired resistance between the surface adjacent region 21 and the third electrode 22.

A generalized example illustrating the order of magnitude of the various time periods or time constants of the elements of the device and circuits threrfor and the operating parameters thereof is instructive. Assume that the variable capacitance device is to be used as a tuning capacitor for the r-f stage of a television receiver. Assuming a carrier frequency of 100 megahertz, a time period of 0.1 microsecond for a cycle thereof is obtained. Assuming that the time constant of the resistance of the channel region and the capacitance across the first and second electrodes of the device should be one thousandth the carrier frequency of $10^{-5}$ seconds and assuming that the nominal capacitance of the device is 20 picofarads yields a resistance of $5 \times 10^{+5}$ ohms. Assuming that the time required to completely invert the surface of the semiconductor layer of an isolated CIS capacitor after the instantaneous application of a depletion producing voltage is one hundred times the RC time constant of the channel resistance and device capacitance yields a time period of 0.001 second. Semiconductor material having the latter capability is readily obtained. The desired resistance of the channel region can be obtained by forming the P-type channel region of the required geometric dimensions and resistivity as in the embodiments of FIGS. 1, 2, 8, 11. Of course, if inversion in conductivity of the channel region is utilized as in the embodiments of FIGS. 5, 6 and 7, the channel regions are designed to provide the desired resistance in response to the geometric design and the operating potentials to be used.

While the various capacitance devices in accordance with the present invention have been shown in operative association with various circuits, it is to be understood that the circuits are shown as illustrative and are not to be construed as limiting the manner in which the devices may be used.

While in the illustrative embodiments described, the semiconductor material utilized is silicon, other semiconductor materials such as germanium and Group III–Group V compounds, such as gallium arsenide, could be used. Also, while in the illustrative embodiments described the insulating member was constituted of silicon dioxide, other insulating materials such as silicon nitride, silicon oxynitride, and aluminum oxide would be suitable. Also, the conductive plates could be constituted of any of a number of conductive materials, metallic and non-metallic such as molybdenum, tungsten, aluminum and polycrystalline silicon. In general, however, these electrodes require high conductivity so that high Q circuits may be obtained. For applications where Q is of less importance lower conductivity materials may be used.

While the arrays of the embodiments shown in FIGS. 5, 6, 7 and 11 have been described as constituted of an N-type conductivity semiconductor material, P-type conductivity semiconductor material could as well be used. Of course, in such a case the applied potentials would be reversed in polarity. In choosing the desired substrate conductivity type considerations of low series resistance between the first two electrodes is important. For this reason, when the semiconductor is silicon an N-type substrate is preferred.

While the body of semiconductor material utilized in the devices have been shown as constituted of a strongly N-type conductivity substrate of low resistivity and an epitaxial layer of high resistivity thereon of the desired net activator concentration or resistivity, the substrate layer could be dispensed with and low resistance connection made directly to the high resistivity layer. However, the epitaxial layer provides a convenient starting point for forming thin high resistivity layers thereon and also for making low resistance connection thereto to provide low series resistance and hence high Q in the variable capacitance device.

The various techniques utilized in the fabrication or formation of devices including epitaxially growing silicon layers on silicon, thermally growing silicon dioxide on silicon, forming apertures in silicon dioxide layers by photolithographic masking and etching, implantating and diffusing activators through apertures in silicon dioxide masking layers into an underlying semiconductor layer to form regions of desired type, geometry and electrical characteristics, metallizing of regions to form desired electrical connection paths and the like are all well known to those skilled in the art. Utilizing such techniques it is readily apparent to one skilled in the various ways in which the devices of the present invention may be fabricated. For example, whereas embodiments described all make use of a single uniform oxide thickness across the substrate having contacts applied thereto, in many embodiments the variable capacitor will be formed on a substrate having regions of relatively thin and regions of relatively thick insulators with the capacitor formed in the thin regions and contact formed by extending the conductive layer up over the thicker portions.

Accordingly, while the invention has been described in specific embodiments it will be appreciated that modifications may be made by those skilled in the art and it is intended by the appended claims to cover all such modifications and changes as fall within the true spirit and scope of the invention.

What I claim as new and desire to secure by Letters Patent of the United States is:

1. A semiconductor device for providing voltage variable capacitance for a high frequency signal comprising a body of semiconductor material of one type conductivity having a major surface, a film of conductive material insulatingly overlying a first surface-adjacent region of said body and constituting a first capacitance providing electrode of said device, conductive means in electrical contact with another region of said body and forming a second electrode of said device, a third electrode for controlling the capacitance between said first and second electrodes, means for providing a first channel region of opposite type conductivity adjacent said major surface connected between said third electrode and said first surface-adjacent region, the time constant of the capacitance of said first surface adjacent region and the resistance of said first channel region being large in relation to a period of said high frequency signal.

2. The combination of claim 1 comprising a first biasing means for applying a depletion producing voltage between said first and second electrodes, a second biasing means for applying another voltage between said second and third electrodes to establish in said first surface-adjacent region a potential between the potentials of said first and second electrodes, means for applying a high frequency signal between said first and second electrodes.

3. The combination of claim 2 in which the voltage applied between said second and third electrodes by asid second biasing means is varied to vary the capacitance presented between said first electrode and said second electrode to said high frequency signal.

4. The combination of claim 2 in which the amplitude of said high frequency signal applied between said first and second electrodes is small in relation to the magnitude of said depletion producing voltage.

5. The combination of claim 1 in which the time constant of the capacitance of said surface adjacent region and the resistance of said first channel region is short in relation to the time for fully establishing an inversion channel in said first surface adjacent region in response to normal minority carrier generation therein.

6. The combination of claim 1 in which said channel providing means includes an activator induced surface adjacent region of said opposite type conductivity one portion of which contacts said third electrode and another portion of which contacts said first surface-adjacent region of said body.

7. The combination of claim 1 in which said channel providing means includes an actinator induced surface adjacent region of opposite conductivity type spaced from said first surface adjacent region by a second channel region in said body of semiconductor material of one conductivity type, one portion of said surface adjacent region of opposite conductivity contacting said third electrode, means for inverting the conductivity type of said second channel region.

8. The combination of claim 1 in which said channel providing means includes a pair of activator induced surface adjacent regions of opposite conductivity type spaced apart to form a second channel region therebetween, one of said pair of regions of opposite conductivity type contacting said first surface adjacent region and the other of said pair of regions of opposite conductivity type contacting said third electrode, and voltage means for rendering said second channel region opposite in conductivity type to said one conductivity type.

9. The combination of claim 6 in which said surface adjacent region of said opposite type conductivity is elongated.

10. The combination of claim 9 in which said surface adjacent region of said opposite type conductivity is curvilinear.

11. The combination of claim 1 including another body of semiconductor material of opposite type conductivity having a major surface, a film of conductive material insulatingly overlying a first surface-adjacent region of said other body and constituting a fourth and capacitance providing electrode of said device, conductive means in electrical contact with another region of said other body and forming a fifth electrode of said device, a sixth electrode for controlling the capacitance between said fourth and fifth electrodes, means providing a first channel region of one type conductivity adjacent said major surface of said other body between said sixth electrode and said surface-adjacent region of said other body, the time constant of the capacitance of said surface-adjacent region of said other body and the resistance of said channel region of said other body being large in relation to a period of said high frequency signal, said first and fourth electrodes conductively connected together, said second and fifth electrodes capacitively connected together.

12. The combination of claim 11 in which said first channel region of said opposite type conductivity is an activator induced surface adjacent region of said opposite conductivity type one portion of which contacts said third electrode and another portion of which contacts said first surface adjacent region of said one body and in which said first channel region of said one type conductivity is another activator induced surface adjacent region of one conductivity type one portion of which contacts said sixth electrode and another portion of which contacts said first surface adjacent region of said other body.

13. The combination of claim 11 including means for applying a first depletion producing voltage between said first and second electrodes and for applying a second depletion producing voltage between said fourth and fifth electrodes, means for applying a third voltage between said second and third electrodes to establish in the first surface-adjacent region of said one body a potential between the potentials of said first and second electrodes, means for applying a fourth voltage between said fifth and sixth electrodes to establish in the first surface-adjacent region of said other body a potential between the potentials of said fourth and fifth electrodes, means for applying a high frequency signal between said first and second electrodes.

14. The semiconductor device of claim 1 including a second film of conductive material insulatingly overlying a second surface-adjacent region of said body and constituting a second capacitance providing electrode of said device, another means providing a second channel region of opposite type conductivity adjacent said major surface of said one body of semiconductor material connected between said third electrode and said second surface-adjacent region, the time constant of the capacitance of said second surface-adjacent region and the resistance of said second channel region being large in relation to a period of said high frequency signal.

15. The semiconductor device of claim 14 including means for applying a first depletion producing voltage between said first and second electrodes and for applying a second depletion producing voltage between said second and fourth electrodes, means for applying a third voltage between said second and third electrodes to establish in said first surface-adjacent region a predetermined potential between the potentials of said first and second electrodes and to establish in said second surface-adjacent region said predetermined potential between the potentials of said second and fourth electrodes.

16. The semiconductor device of claim 1 in which the conductivity of said body of semiconductor material near the surface of said first surface adjacent region is greater than the conductivity of the remainder of said first surface adjacent region.

17. The semiconductor device of claim 1 in which said first channel region contacts a small portion of the peripheral surface of said first surface-adjacent region.

18. A semiconductor device for providing voltage variable capacitance for a high frequency signal substantially independent of the amplitude thereof comprising a body of semiconductor material of one type conductivity having a major surface, a film of conductive material insulatingly overlying a first surface-adjacent region of said body and constituting a first capacitance providing electrode of said device, conductive means in electrical contact with another region of said body and forming a second electrode of said device, a first biasing means for applying a depletion producing voltage between said first and second electrodes to produce an inversion layer in said first surface adjacent region and establish a controllable capacitance between said first and second electrodes, a third electrode for controlling the capacitance between said first and second electrodes, means for providing a first channel region of opposite type conductivity adjacent said major surface connected between said third electrode and said inversion layer of said first surface-adjacent region, a second biasing means for applying another voltage between said second and third electrodes to establish a potential in said inversion layer intermediate the potentials of said first and second electrodes, means for applying a high frequency signal between said first and second electrodes, the time constant of the capacitance of said inversion layer in respect to said substrate and the resistance of said first channel region being large in relation to a period of said high frequency signal.

* * * * *